(12) United States Patent
Chang

(10) Patent No.: US 7,737,711 B2
(45) Date of Patent: Jun. 15, 2010

(54) TEST APPARATUS HAVING POGO PROBES FOR CHIP SCALE PACKAGE

(75) Inventor: Chiu-Fang Chang, Hsin-Chu (TW)

(73) Assignee: King Yuan Electronics Co., Ltd., Hsin-Chu (TW)

(\*) Notice: Subject to any disclaimer, the term of this patent is extended or adjusted under 35 U.S.C. 154(b) by 126 days.

(21) Appl. No.: 12/170,316

(22) Filed: Jul. 9, 2008

(65) Prior Publication Data

US 2009/0289652 A1   Nov. 26, 2009

(30) Foreign Application Priority Data

May 22, 2008   (TW)   ............... 97118845 A

(51) Int. Cl.
  *G01R 1/073*   (2006.01)
(52) U.S. Cl. .................. 324/755; 324/754; 324/761
(58) Field of Classification Search .............. None
  See application file for complete search history.

(56) References Cited

U.S. PATENT DOCUMENTS

| | | | |
|---|---|---|---|
| 4,560,223 A * | 12/1985 | Cooney et al. ............ 439/387 |
| 6,046,597 A * | 4/2000 | Barabi ....................... 324/755 |
| 6,208,155 B1 * | 3/2001 | Barabi et al. ............... 324/754 |
| 6,220,870 B1 | 4/2001 | Barabi et al. |
| 6,464,511 B1 | 10/2002 | Watanabe et al. |
| 6,677,772 B1 * | 1/2004 | Faull ......................... 324/761 |
| 6,685,492 B2 * | 2/2004 | Winter et al. .............. 439/219 |

\* cited by examiner

*Primary Examiner*—Vinh P Nguyen
(74) *Attorney, Agent, or Firm*—Ming Chow; Sinorica, LLC

(57) ABSTRACT

A pogo-type probe to be installed in a probe socket and a probe card for testing chip scale package of a semiconductor device is characterized in that the pogo probe has a hollow main body for receiving at least one resilient element internally and the main body comprises two end portions disposed with a first probe head and a second probe head respectively, wherein each of the probe heads is composed of a plurality of taper members to form a crown shape, and each of the taper members has an individual chamfer so that each chamfer has a tip to contact each contact pad of the semiconductor device under test for chip scale package.

13 Claims, 5 Drawing Sheets

TEST APPARATUS HAVING POGO PROBES FOR CHIP SCALE PACKAGE

BACKGROUND OF THE INVENTION

1. Technical Field

The present invention relates to a pogo-type probe to be installed in a probe socket and a probe card. More particularly, the present invention relates to a pogo probe having crown-shaped probe heads for testing semiconductor devices for chip scale package.

2. Description of Related Art

Conventionally, an integrated circuit component is tested with vertical or cantilever probes installed in a probe socket, which is vertically attached on a printed circuit board to form a probe card for testing. Positional accuracy of the probes is maintained by the edge shape of the probe socket. Then, deflection that results from contact between the probes and the semiconductor device under test facilitates compression to the extent required for testing. However, the deflection is insufficient for compensation for errors in flatness of the semiconductor device under test or related hardware, and thus problems associated with poor contact tend to occur during testing.

U.S. Pat. Nos. 6,220,870, 6,464,511 and 6,685,492 disclose a crown-shaped probe head, so that a probe can be designed with crown-shaped, rather than flat, tips to increase the reliability of contact between the probe and solder balls. In addition, probe cards produced by manufacturing giants such as FormFactor and Feinmetall use probes that deflect only to a limited extent (less than 0.15 mm) when contacting a semiconductor device under test. Hence, errors in flatness between the probes and the semiconductor device under test cannot be improved. In other words, all the aforementioned prior art fails to solve the problem of conventional probe cards, namely poor contact and the resultant compromised test reliability because of non-flatness at relative level between conventional probes and a semiconductor device under test during testing.

As mentioned above, the configuration of conventional probes and the way conventional probes are attached on a probe socket or a probe card have become a source of inconvenience and troubles for test operators during testing. Therefore, it is an urgent issue in the related industry to provide a convenient and effective probe, probe socket and probe card that can be easily used by test operators and can prevent the foregoing shortcomings of the prior art.

BRIEF SUMMARY OF THE INVENTION

In order to provide a probe capable of more effective contact with solder balls and to ensure test reliability by maintaining better relative flatness between a probe socket or a probe card and a semiconductor device under test, so as to overcome the shortcomings of the prior art, the present invention provides a pogo probe to be installed in a probe socket for testing a chip scale package of a semiconductor device under test. The pogo probe has a hollow main body for receiving at least one resilient element internally and the hollow main body comprises two end portions provided respectively with a first probe head and a second probe head, wherein each of the first and second probe heads is composed of a plurality of taper members to form a crown shape, and a chamfer is formed on each of the taper members so that a tip of the chamfer contacts a contact pad of the semiconductor device under test.

Therefore, a primary objective of the present invention is to provide a probe socket comprising a pressing element, so that probes in the probe socket are preloaded to maintain a better common plane of probe heads relative to a semiconductor device under test.

A secondary objective of the present invention is to provide a probe card comprising a pressing element, so that a probe socket can match accurately with a printed circuit board disposed thereon, allowing probes in the probe socket to be preloaded.

BRIEF DESCRIPTION OF THE SEVERAL VIEWS OF THE DRAWINGS

The invention as well as a preferred mode of use, further objectives and advantages thereof will best be understood by reference to the following detailed description of illustrative embodiments when read in conjunction with the accompanying drawings, wherein.

DETAILED DESCRIPTION OF THE INVENTION

The present invention provides a pogo probe, and more particularly, a pogo probe to be installed in a probe socket and a probe card for testing a chip scale package of an integrated circuit component. The principles of probe testing employed in the present invention should be readily understood by a person of ordinary skill in the art, so that a detailed description thereof is omitted herein. In addition, the drawings referred to in the following description are intended to demonstrate only schematically structures related to features of the present invention. Therefore, the drawings are not drawn according to actual dimensions, as it is not necessary for them to be so.

Figure 1:
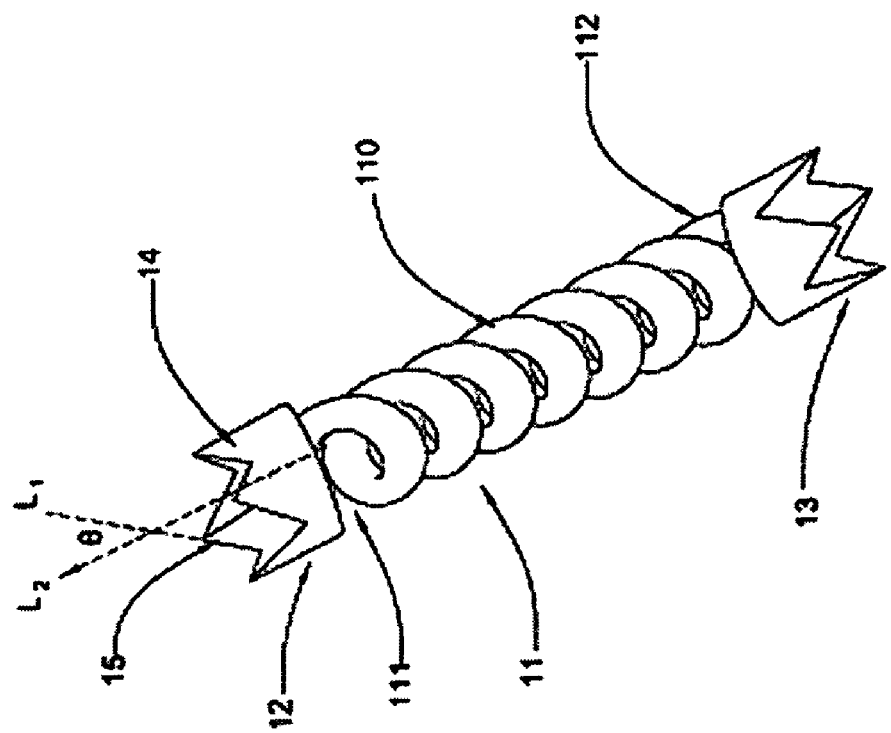
FIG. 1 is a perspective view of a pogo probe according to a first preferred embodiment of the present invention.

Refer to FIG. 1 for a perspective view of a pogo probe 10 according to a first preferred embodiment of the present invention. The pogo probe 10 can be installed in a probe socket (not shown) for testing a chip scale package of a semiconductor device under test, and has a hollow main body 11 for internally receiving a resilient element 110. The resilient element 110 is depicted as a spiral spring in the drawing. The main body 11 further comprises two end portions 111 and 112 disposed with a first probe head 12 and a second probe head 13 respectively. Each of the first and second probe heads 12 and 13 is composed of a plurality of taper members 14 so as to form a crown shape, wherein each of the taper members 14 has an individual chamfer 15. A tip of each of the chamfers 15 is provided to contact an individual contact pad (not shown) of the semiconductor device under test, allowing the pogo probe 10 to contact the contact pad more reliably.

In the embodiment described above, a chamfer line $L_1$ extending from each of the chamfer 15 and a normal line $L_2$ extending through a center of a corresponding one of the end portions 111 and 112 to form an chamfer angle $\theta$, wherein the chamfer angle $\theta$ ranges from 0° to 45°, and preferably 30°. Besides, each of the chamfers 15 forms a generally flat blade. In addition, the taper members 14 may have the same or different configurations. Furthermore, all the chamfers 15 formed on the taper members 14 may have the same or different configurations. Moreover, the two end portions 111 and 112 are further hardened to increase their hardness.

Figure 2A:
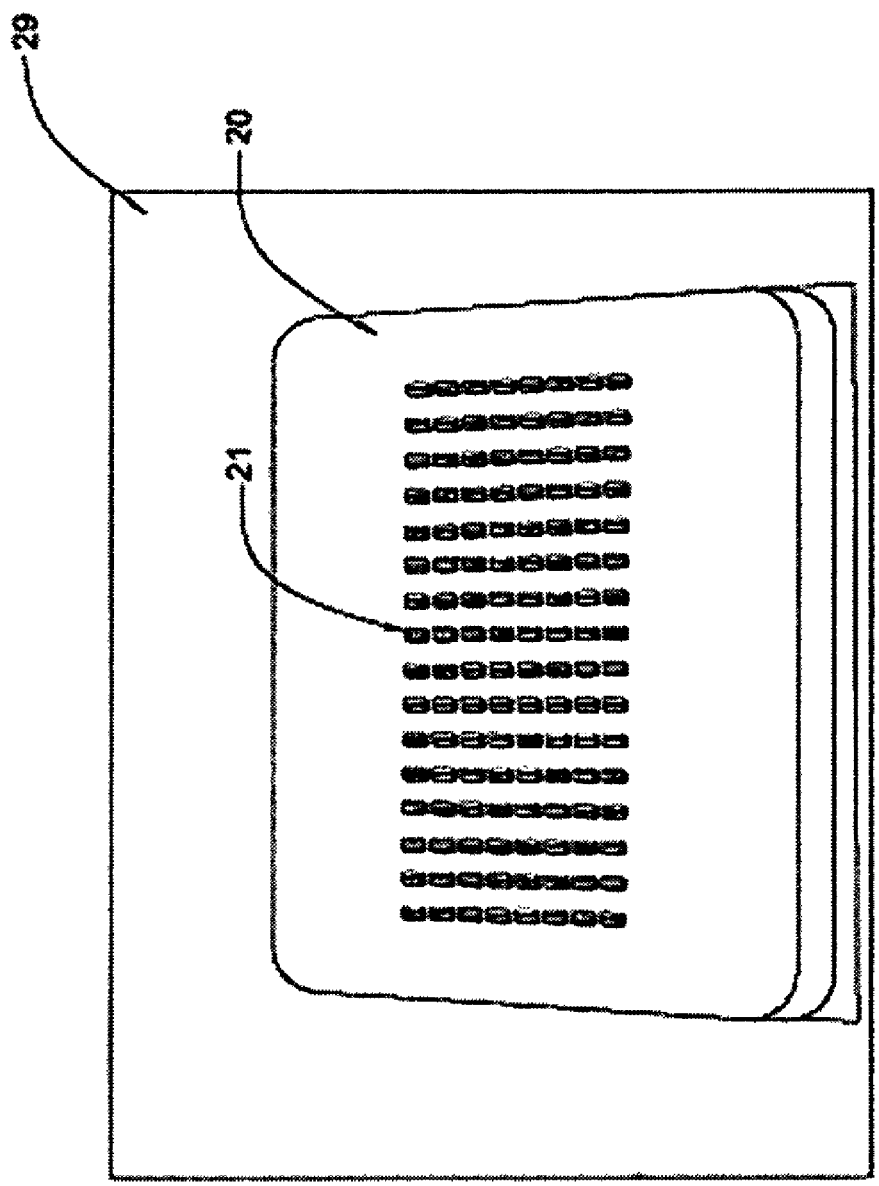
FIG. 2A is a perspective view of a probe socket according to a second preferred embodiment of the present invention.
Figure 2B:
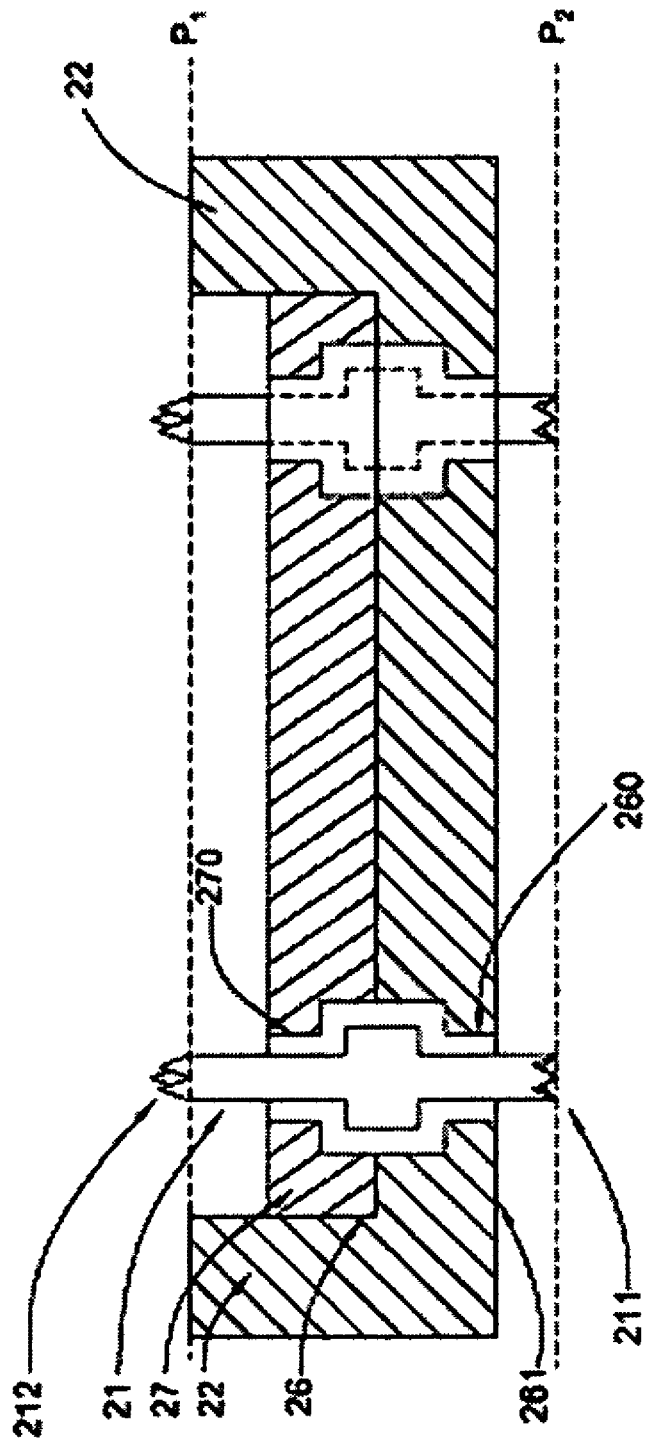
FIG. 2B is a cross-sectional view of the probe socket according to the second preferred embodiment of the present invention.

Referring now to FIGS. 2A and 2B, which are a perspective view and a cross-sectional view of a probe socket 20 according to a second preferred embodiment of the present invention, respectively, the probe socket 20 comprises a plurality of pogo probes 21, a recessed portion 26 and a pressing element 27, wherein the pogo probes 21 are loosely engaged and disposed in the probe socket 20. The probe socket 20 has a bottom surface for contact with a semiconductor device under test (not shown) for chip scale package, and the probe socket 20 has a top surface to provide a shoulder portion 22 for abutting against a printed circuit board 29. The recessed portion 26 is centrally formed in the probe socket 20 and has a bottom portion 261 to provide a plurality of first through holes 260 penetratable by first probe heads 211 on lower halves of the pogo probes 21 for contact with contact pads (not shown) of the semiconductor device under test. The pressing element 27 is disposed on the recessed portion 26 and provided with a plurality of second through holes 270 penetratable by second probe heads 212 on upper halves of the pogo probes 21 to abut against the printed circuit board 29, so that the pogo probes 21 are stressed in a preloaded state before coming into contact with the semiconductor device under test (not shown). The printed circuit board 29 can be directly attached to the shoulder portion 22 in a locking manner to keep the pogo probes 21 in the preloaded state. As the shoulder portion 22 of the probe socket 20 is slightly lower than the second probe heads 212, when the printed circuit board 29 is pressed downwards towards the shoulder portion 22, the resilience of the pogo probes 21 in the probe socket 20 allows the printed circuit board 29 to abut against the shoulder portion 22 so as to be aligned with a first coplane $P_1$ defined as a reference plane. Consequently, the first probe heads 211 of the pogo probes 21 are aligned with a second coplane $P_2$, ensuring that the first probe heads 211 contact the semiconductor device under test (not shown) coplanarly (i.e., in the second coplane $P_2$) in the preloaded state. Hence, not only is the semiconductor device under test protected from damage, but the reliability of contact between pogo probes and solder balls disposed on the semiconductor device is enhanced.

In the embodiment described above, the pogo probes 21 are distributed in the probe socket 20 at a pitch ranging from 0.1 cm to 1.0 cm, and preferably a spacing of 0.5 cm. Meanwhile, the pogo probes 21 are preferably arranged in the probe socket 20 in a 32×64 matrix. Technical features and structures of the pogo probes 21 in the probe socket 20 and the first and second probe heads 211 and 212 are the same as their counterparts in the first preferred embodiment of the present invention.

Figure 3A:
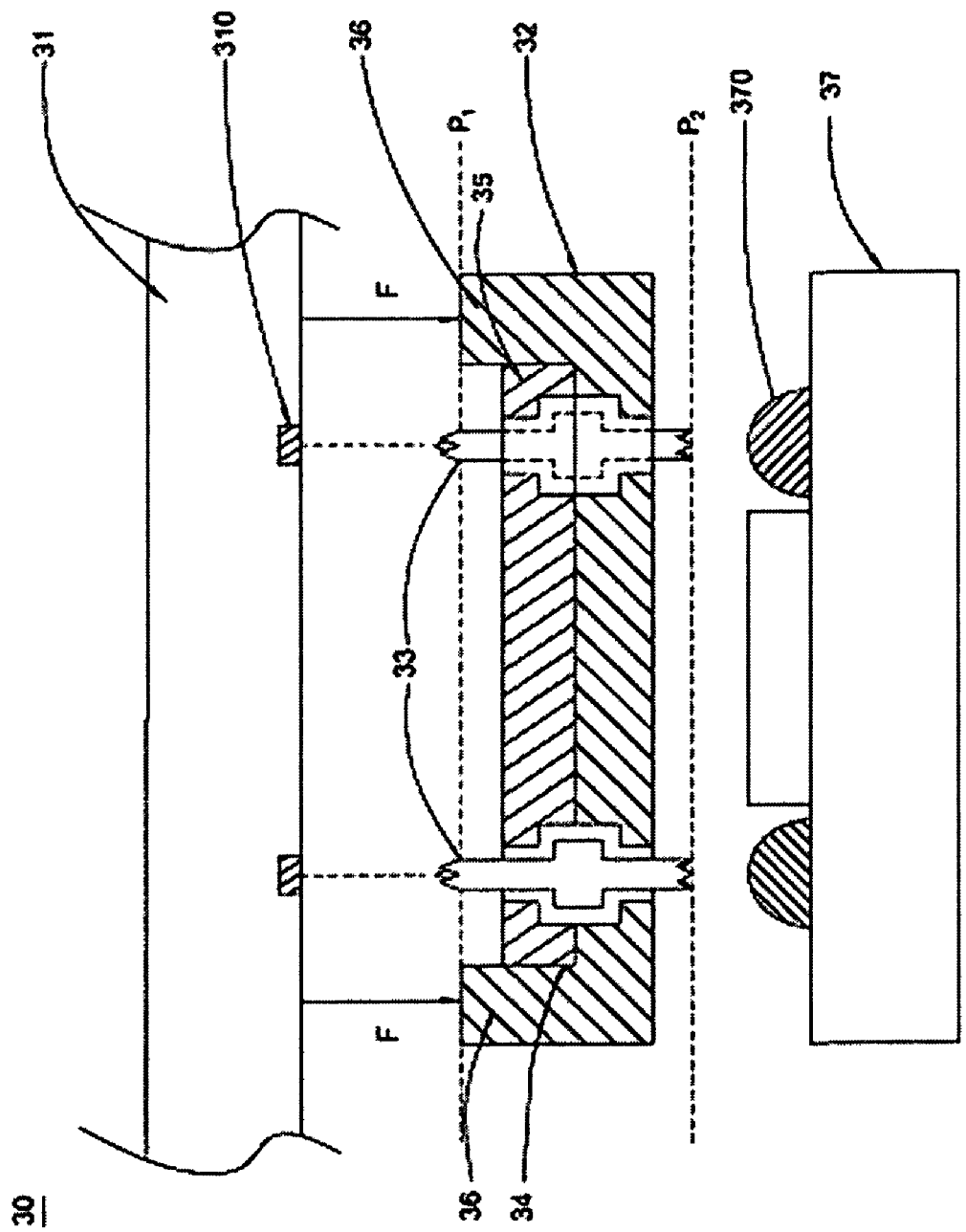
FIG. 3A is an exploded view of a probe card according to a third preferred embodiment of the present invention.
Figure 3B:
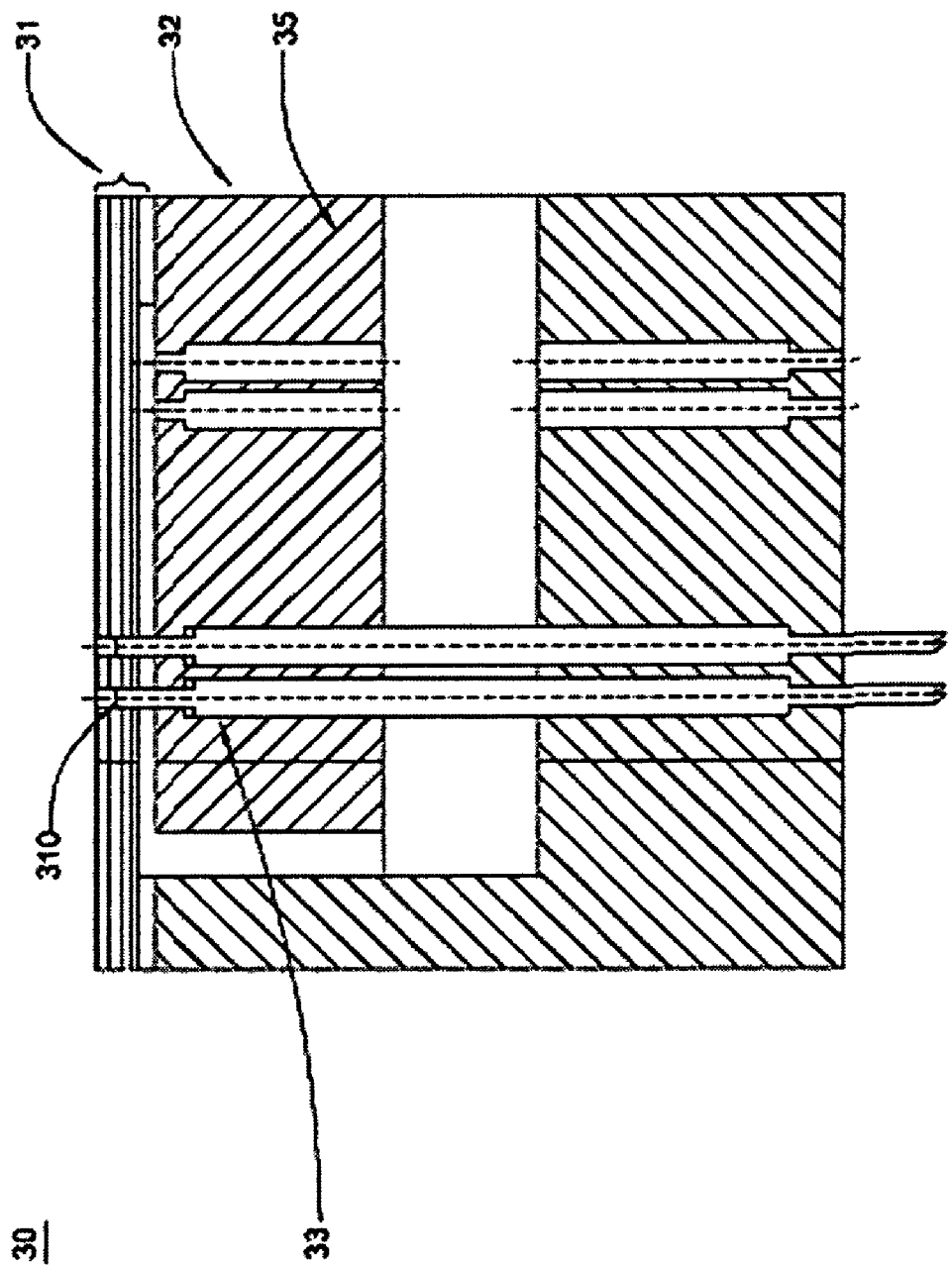
FIG. 3B is an assembled view of the probe card according to the third preferred embodiment of the present invention.

FIGS. 3A and 3B are an exploded view and an assembled view of a probe card 30 according to a third preferred embodiment of the present invention, respectively. The probe card 30 can test a chip scale package of a semiconductor device under test 37 by contacting contact pads 370 of the semiconductor device under test 37. The probe card 30 comprises a test substrate 31 and a probe socket 32, wherein the test substrate 31 may further comprise a printed circuit board (not shown). The probe socket 32 comprises a plurality of pogo probes 33, a recessed portion 34, a pressing element 35 and a shoulder portion 36. The test substrate 31 comprises a plurality of engaging pads 310 for contact with the plurality of pogo probes 33 in the probe socket 32. After a bottom surface of the test substrate 31 is accurately attached on the shoulder portion 36 of the probe socket 32 along a locking direction F, second ends of the pogo probes 33 are kept in a preloaded state and aligned with a first coplane $P_1$ defined as a reference plane. And owing to the preloaded state and the first coplane $P_1$, first ends of the pogo probes 33 are also aligned with a second coplane $P_2$ to increase test reliability. In addition, the pogo probes 33 are distributed in the probe socket 32 at a spacing ranging from 0.1 cm to 1.0 cm, preferably a spacing of 0.5 cm. Meanwhile, the pogo probes 33 are preferably arranged in the probe socket 32 in a 32×64 matrix. Technical features and structures of the probe socket 32 and the pogo probes 33 are the same as their counterparts in the first preferred embodiment of the present invention while technical features and structures of the recessed portion 34, the pressing element 35 and the shoulder portion 36 are the same as their counterparts in the second preferred embodiment of the present invention.

The present invention has been described with preferred embodiments thereof and it is understood that the embodiments are not intended to limit the scope of the present invention. Moreover, as the content disclosed herein should be readily understood and can be implemented by a person skilled in the art, all equivalent changes or modifications which do not depart from the spirit of the present invention are encompassed by the appended claims.

The invention claimed is:

1. A probe socket, provided with a plurality of pogo probes, comprising a bottom surface for contacting a semiconductor device under test for chip scale package and a top surface having a shoulder portion for contact with a printed circuit board, characterized in that:
   each of the pogo probe has a hollow main body for receiving at least one resilient element internally and the main body comprises two end portions respectively with a first probe head and a second probe head, wherein each of the first and second probe heads is composed of a plurality of taper members to form a crown shape and each of the taper members has an individual chamfer;
   the probe socket has a recessed portion in its center, wherein the recessed portion has a bottom portion provided with a plurality of first through holes penetratable by the first probe heads of the pogo probes for contact with contact pads of the semiconductor device under test;
   a pressing element is disposed in the recessed portion and provided with a plurality of second through holes penetratable by the second probe heads of the pogo probes for contact with the printed circuit board so as to maintain a preloaded state; and
   the shoulder portion of the probe socket is lower than the second probe heads to allow the printed circuit board to abut against the shoulder portion of the probe socket, so as to define a reference plane for the second probe heads of the pogo probes.

2. The probe socket as claimed in claim 1, wherein the pogo probes are spaced at a pitch ranging from 0.1 cm to 1.0 cm.

3. The probe socket as claimed in claim 1, wherein the pogo probes are arranged in a 32×64 matrix.

4. The probe socket as claimed in claim 1, wherein the chamfer has a chamfer angle ranging from 0° to 45° and the chamfer angle is formed between a chamfer line extending from the chamfer and a normal line corresponding to the end portions.

5. The pogo socket as claimed in claim 1, wherein the resilient element is a spiral configuration.

6. The pogo socket as claimed in claim 1, wherein each of the chamfers has a generally flat blade.

7. The pogo socket as claimed in claim 1, wherein the taper members have a substantially identical configuration.

8. The pogo socket as claimed in claim 1, wherein the taper members have a substantially identical chamfer.

9. The pogo socket as claimed in claim 1, wherein the two end portions of the main body of each said pogo probe are further hardened to increase hardness thereof.

10. A probe card comprising a test substrate and at least one probe socket having a plurality of pogo probes, characterized in that:

each said pogo probe has a hollow main body receiving at least one resilient element internally and the main body comprises two end portions respectively with a first probe head and a second probe head, wherein each of the first and second probe heads is composed of a plurality of taper members to form a crown shape and each of the taper members has an individual chamfer;

the probe socket has a recessed portion in its center, wherein the recessed portion has a bottom portion provided with a plurality of first through holes penetratable by the first probe heads of the pogo probes for contact with contact pads of the semiconductor device under test for chip scale package;

a pressing element is disposed in the recessed portion and provided with a plurality of second through holes penetratable by the second probe heads of the pogo probes for contact with the printed circuit board so as to maintain a preloaded state; and the probe socket has a shoulder portion on its top formed to allow the test substrate to be attached on the shoulder portion accurately and thereby form a reference plane for the second probe heads, such that the preloaded state and the reference plane further allow the first probe heads of the pogo probes to be aligned with a common plane for contact with the semiconductor device under test for chip scale package.

11. The probe card as claimed in claim 10, wherein the test substrate comprises a printed circuit board.

12. The probe card as claimed in claim 10, wherein the pogo probes are spaced at a pitch ranging from 0.1 cm to 1.0 cm.

13. The probe card as claimed in claim 10, wherein the pogo probes are arranged in a 32×64 matrix.

* * * * *